(12) United States Patent
Wang et al.

(10) Patent No.: US 11,931,783 B2
(45) Date of Patent: Mar. 19, 2024

(54) RECYCLE APPARATUS FOR PHOTOVOLTAIC MODULE

(71) Applicant: INDUSTRIAL TECHNOLOGY RESEARCH INSTITUTE, Hsinchu (TW)

(72) Inventors: Teng-Yu Wang, Hsinchu (TW); Chih-Lung Lin, Hsinchu (TW); Cheng Chuan Wang, Changhua County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 716 days.

(21) Appl. No.: 17/072,349

(22) Filed: Oct. 16, 2020

(65) Prior Publication Data

US 2021/0138520 A1 May 13, 2021

Related U.S. Application Data

(60) Provisional application No. 62/933,048, filed on Nov. 8, 2019.

(30) Foreign Application Priority Data

Jul. 30, 2020 (TW) .................................. 109125834

(51) Int. Cl.
*B26D 3/28* (2006.01)
*B09B 3/40* (2022.01)
(Continued)

(52) U.S. Cl.
CPC ................. *B09B 3/80* (2022.01); *B09B 3/40* (2022.01); *B09B 5/00* (2013.01); *B26D 3/281* (2013.01); *B26D 7/10* (2013.01)

(58) Field of Classification Search
CPC .... B09B 5/00; B09B 3/80; B09B 3/40; B26D 3/281; B26D 7/10; H01L 31/18
(Continued)

(56) References Cited

U.S. PATENT DOCUMENTS 3,438,835 A * 4/1969 Chen ...................... B26D 1/626
83/345
2011/0283851 A1* 11/2011 Overrath .............. B21D 22/022
83/15
(Continued)

FOREIGN PATENT DOCUMENTS

CN 103085116 5/2013
CN 203055967 7/2013
(Continued)

OTHER PUBLICATIONS

Taiwanese Office Action issued in corresponding application No. 109125834, dated Apr. 27, 2021.
(Continued)

*Primary Examiner* — Nhat Chieu Q Do
(74) *Attorney, Agent, or Firm* — Maschoff Brennan (57) ABSTRACT

A recycle apparatus includes a conveyor, a flattening device, and a cutting tool. The conveyor includes a first roller and a second roller opposite to each other. The flattening device is located aside the first roller and the second roller. The cutting tool is located aside the flattening device. The flattening device is located between the first roller and the second roller of the conveyor and the cutting tool. The first roller and the second roller is configured to press and feed the photovoltaic module to the flattening device for allowing the photovoltaic module to be flattened by the flattening device, and then the flattened photovoltaic module is fed to the
(Continued)

cutting tool by the first roller and the second roller for allowing the back sheet to be separated from the glass sheet assembly by the cutting tool.

8 Claims, 8 Drawing Sheets

(51) Int. Cl.
*B09B 3/80* (2022.01)
*B09B 5/00* (2006.01)
*B26D 7/10* (2006.01)

(58) Field of Classification Search
USPC .............................................................. 83/18
See application file for complete search history.

(56) References Cited

U.S. PATENT DOCUMENTS

| 2015/0034250 | A1* | 2/2015 | Masuda | ............... | B32B 37/10 |
|---|---|---|---|---|---|
| | | | | | 156/583.1 |
| 2018/0254364 | A1 | 9/2018 | Kawanishi | | |
| 2021/0162729 | A1* | 6/2021 | Sakai | ................... | B32B 43/006 |

FOREIGN PATENT DOCUMENTS

| CN | 203277469 | | | 11/2013 | | |
|---|---|---|---|---|---|---|
| CN | 203850323 | | | 9/2014 | | |
| CN | 203910828 | | | 10/2014 | | |
| CN | 204189813 | | | 3/2015 | | |
| CN | 204538053 | | | 8/2015 | | |
| CN | 105118897 | | | 12/2015 | | |
| CN | 205096223 | U | | 3/2016 | | |
| CN | 205428972 | | | 8/2016 | | |
| CN | 106169519 | | | 11/2016 | | |
| CN | 205752211 | | | 11/2016 | | |
| CN | 205810843 | | | 12/2016 | | |
| CN | 206076262 | | | 4/2017 | | |
| CN | 107214878 | | | 9/2017 | | |
| CN | 107425094 | | | 12/2017 | | |
| CN | 107803389 | A | | 3/2018 | | |
| CN | 207789455 | U | | 8/2018 | | |
| CN | 207789455 | U | * | 8/2018 | | |
| CN | 109365482 | A | | 2/2019 | | |
| DE | 2145303 | A | * | 3/1973 | ............... | C14B 1/18 |
| DE | 102009026684 | | | 12/2010 | | |
| EP | 2380736 | | | 10/2011 | | |
| EP | 2 998 038 | A | | 3/2016 | | |
| JP | 2006013413 | | | 1/2006 | | |
| JP | 2016157774 | | | 9/2016 | | |
| JP | 2017006839 | | | 1/2017 | | |
| KR | 101638182 | | | 7/2016 | | |
| TW | M550668 | | | 10/2017 | | |

OTHER PUBLICATIONS

Shin et al., "A method to recycle silicon wafer from end-of-life photovoltaic module and solar panels by using recycled silicon wafers" Solar Energy Materials & Solar Cells 162 (2017) 1-6.

Weckend et al., "End-of-Life Management: Solar Photovoltaic Panels" Jun. 2016.

Strachala et al., "Methods for recycling photovoltaic modules and their impact on environment and raw material extraction" 2017.

Lee et al., "Photovoltaic performance of c—Si wafer reclaimed from end-of-life solar cell using various mixing ratios of HF and HNO3" Solar Energy Materials & Solar Cells 160 (2017) 301-306.

* cited by examiner

RECYCLE APPARATUS FOR PHOTOVOLTAIC MODULE

CROSS-REFERENCE TO RELATED APPLICATIONS

This non-provisional application claims priority under 35 U.S.C. § 119(a) on provisional patent application No. 62/933,048 filed in U.S.A on Nov. 8, 2019 and on patent application No(s). 109125834 filed in Taiwan, R.O.C. on Jul. 30, 2020, the entire contents of which are hereby incorporated by reference.

TECHNICAL FIELD

The disclosure relates to a recycle apparatus, more particularly to a recycle apparatus for a photovoltaic module.

BACKGROUND

Wasted photovoltaic (PV) module (also known as "solar panel") can be recycled. Generally, a proper recycling process involves physically disassembling and separating PV module, collecting its reusable elements, such as silicon, glass, and semiconductor materials, and incinerating unwanted waste materials. However, the back sheet of the PV module contains fluorine, thus incinerating the back sheet will generate toxic substances needed to be collected by other apparatus while incinerating. Thus, a relatively cost-effective way is to remove the fluorine-containing back sheet before the process of incinerating.

Shattering is often found in the glass sheets of the wasted PV modules. When the shattering occurs on a large portion of the panel's face, the glass is unable to retain the panel in flat. As a result, the internal stress in layers may cause the panel to bend. The back sheet can be removed from the glass sheet by cutting, rolling, or pulling, but these approaches need the PV module to stay in flat so as to hold it in position. On the contrary, a PV module with shattered glass is bent out of shape so that the panel is unable to be held in position during the aforementioned back sheet removal processes.

There are chemical processing processes can be used for the separation of the back sheet from the shattered glass, but they involve generation of variety of pollutant into the environment. Accordingly, how to remove the back sheet from a shattered glass has been an important topic in the field.

SUMMARY

One embodiment of the disclosure provides a recycle apparatus. The recycle apparatus is configured to separate a back sheet from a glass sheet assembly of a photovoltaic module. The recycle apparatus includes a conveyor, a flattening device, and a cutting tool. The conveyor includes a first roller and a second roller opposite to each other. The flattening device is located aside the first roller and the second roller. The cutting tool is located aside the flattening device. The flattening device is located between the first roller and the second roller of the conveyor and the cutting tool. The first roller and the second roller is configured to press and feed the photovoltaic module to the flattening device for allowing the photovoltaic module to be flattened by the flattening device, and then the flattened photovoltaic module is fed to the cutting tool by the first roller and the second roller for allowing the back sheet to be separated from the glass sheet assembly by the cutting tool.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 1:
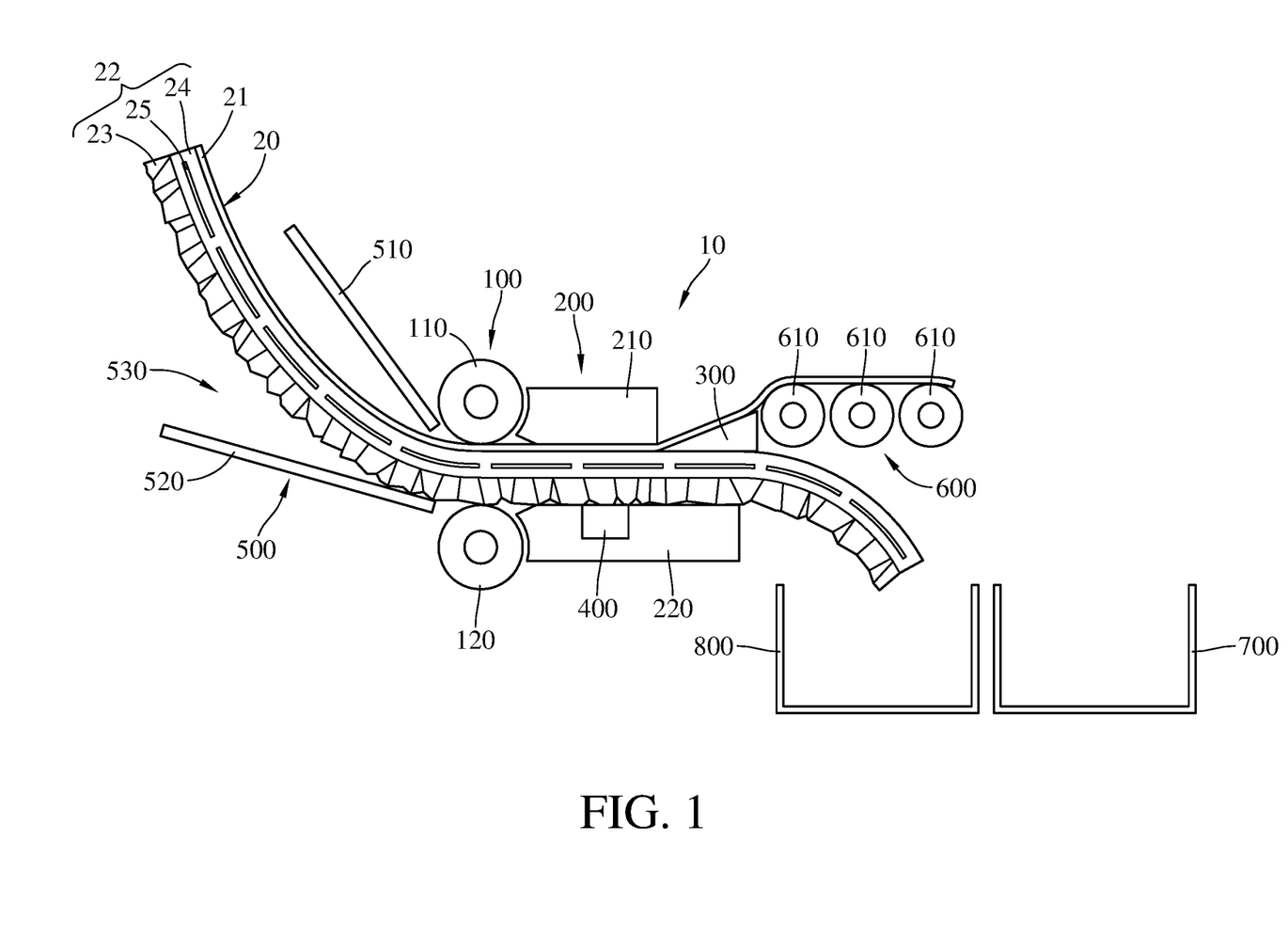
FIG. 1 is a schematic view of a recycle apparatus according to a first embodiment of the disclosure.
Figure 2:
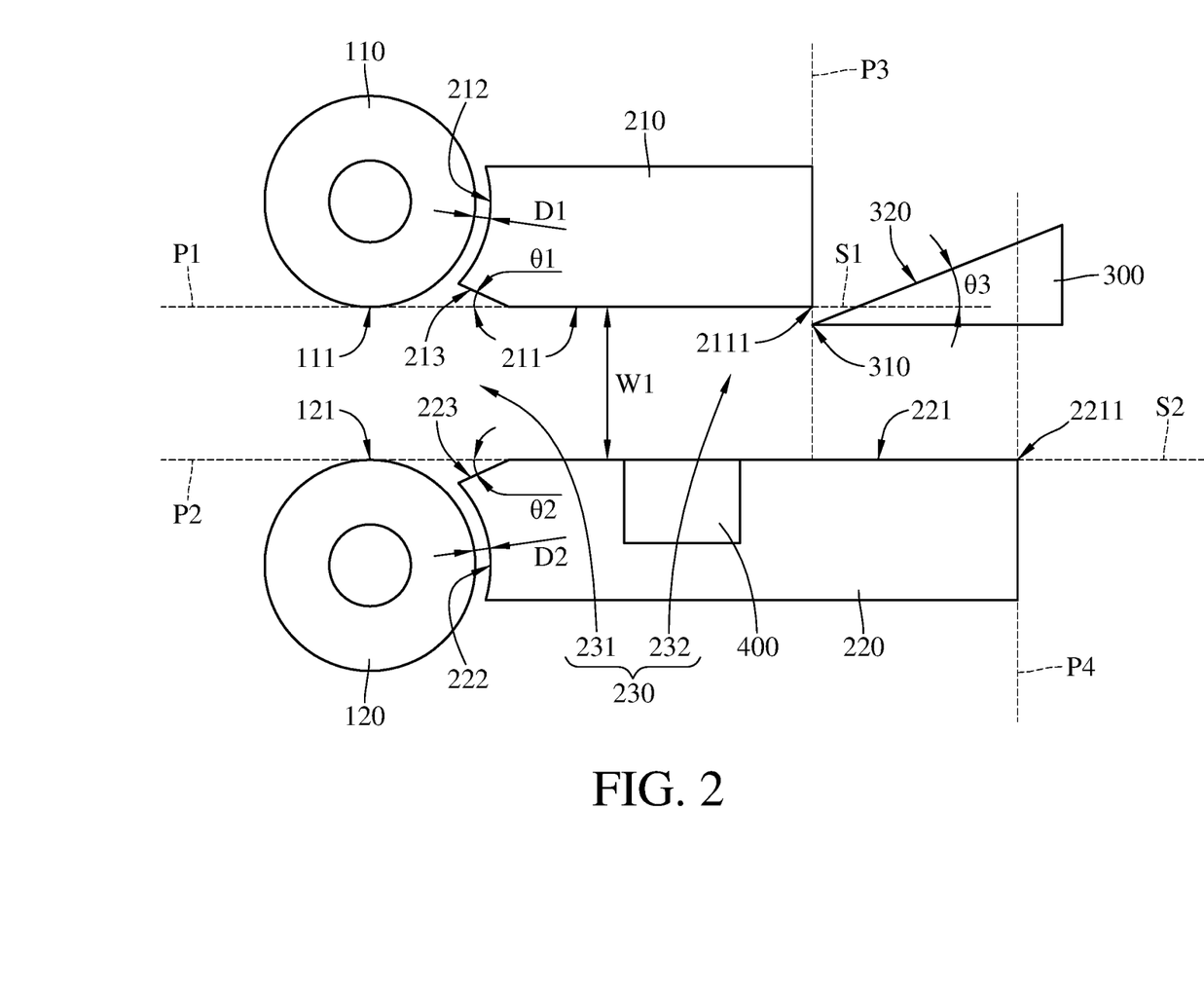
FIG. 2 is a partial enlarged view of the recycle apparatus in FIG. 1.

Referring to FIGS. 1 to 2, there are shown a schematic view of a recycle apparatus 10 according to a first embodiment of the disclosure and a partial enlarged view of the recycle apparatus 10 in FIG. 1.

In this embodiment, the recycle apparatus 10 is configured to separate a back sheet 21 of a wasted photovoltaic module 20 from a glass sheet assembly 22. The glass sheet assembly 22 includes a glass layer 23, an adhesive layer 24, and a battery film 25. The adhesive layer 24 is stacked on the glass layer 23, and the battery film 25 is embedded in the adhesive layer 24. The back sheet 21 is stacked on a side of the adhesive layer 24 away from the glass layer 23; that is, the adhesive layer 24 is located between the glass layer 23 and the back sheet 21.

In this embodiment, the glass layer 23 of the photovoltaic module 20 is shattered, broken, or cracked. Different layers of the photovoltaic module 20 are different in material so that uneven internal stress distribution exists among these layers, however, the shattered glass layer 23 is shattered and unable to hold the layers in shape. As a result, as shown, the internal stress causes the photovoltaic module 20 to bend out of shape.

The recycle apparatus 10 will be introduced in further detail hereinafter. As shown in FIGS. 1 and 2, the recycle apparatus 10 includes a conveyor 100, a flattening device 200, and a cutting tool 300.

The conveyor 100 includes a first roller 110 and a second roller 120 opposite to each other. The first roller 110 and the second roller 120 may be a rubber or silicone covered roller and suitable for pressing the photovoltaic module 20 and feeding it towards the flattening device 200.

In this embodiment, the first roller 110 and the second roller 120 have smooth outer surfaces, but the present disclosure is not limited thereto; in some other embodiments, the first roller and the second roller may have rough outer surfaces.

The flattening device 200 includes a first flattening part 210 and a second flattening part 220 opposite to each other. The first flattening part 210 and the second flattening part 220 are respectively located aside the first roller 110 and the second roller 120. The first flattening part 210 and the second flattening part 220 are configured to press the photovoltaic module 20 so as to flatten the photovoltaic module 20. As shown, when the first flattening part 210 and the second flattening part 220 press the photovoltaic module 20, the first flattening part 210 is located closer to the back sheet 21 of the photovoltaic module 20 than the second flattening part 220. The first flattening part 210 has a first contact surface 211, a first curved concave surface 212, and a first inclined guiding surface 213, and the second flattening part 220 has a second contact surface 221, a second curved concave surface 222, and a second inclined guiding surface 223.

The first contact surface of the first flattening part 210 faces the second contact surface 221 of the second flattening part 220, and the first contact surface 211 is, for example, parallel to the second contact surface 221. In this embodiment, the first roller 110 has a first edge 111 located at a side of the first roller 110 located close to the second roller 120. The second roller 120 has a second edge 121 located at a side of the second roller 120 located close to the first roller 110. In FIG. 2, a plane P1 tangent to the first edge 111 is coplanar with the first contact surface 211 of the first flattening part 210, and a plane P2 tangent to the second edge 121 is coplanar with the second contact surface 221 of the second flattening part 220; that is, the first roller 110 is aligned with the first contact surface 211 of the first flattening part 210, and the second roller 120 is aligned with the second contact surface 221 of the second flattening part 220.

The first curved concave surface 212 of first flattening part 210 faces the first roller 110, and the second curved concave surface 222 of the second flattening part 220 faces the second roller 120. A distance D1 between the first curved concave surface 212 of the first flattening part 210 and the first roller 110 and a distance D2 between the second curved concave surface 222 of the second flattening part 220 and the second roller 120 are both not less than 0.1 millimeters and not larger than 6 millimeters. For example, the distances D1 and D2 are both 2 millimeters.

In this embodiment, the first concave surface 212 of the first flattening part 210 and the second concave surface 222 of the second flattening part 220 allow the first flattening part 210 and the second flattening part 220 to be arranged close to the first roller 110 and the second roller 120, thus the gap between the first flattening part 210 and the first roller 110 and the gap between the second flattening part 220 and the second roller 120 are small enough to ensure that the first roller 110 and the second roller 120 can feed the photovoltaic module 20 to a gap 230 between the first flattening part 210 and the second flattening part 220.

The shapes of the surfaces of the first flattening part 210 and the second flattening part 220 respectively facing the first roller 110 and the second roller 120 may be modified according to actual requirements. In some other embodiments, the surfaces of the first flattening part and the second flattening part respectively facing the first roller and the second roller may be inclined or vertical surfaces.

Two opposite sides of the first inclined guiding surface 213 of the first flattening part 210 are respectively connected to the first contact surface 211 and the first curved concave surface 212, and the first inclined guiding surface 213 is located closer to the first roller 110 than the first contact surface 211. Two opposite sides of the second inclined guiding surface 223 of the second flattening part 220 are respectively connected to the second contact surface 221 and the second curved concave surface 222, and the second inclined guiding surface 223 is located closer to the second roller 120 than the second contact surface 221. The first inclined guiding surface 213 is at a first angle θ1 to an extension surface S1 of the first contact surface 211, where the extension surface S1 is coplanar with the plane P1. The second inclined guiding surface 223 is at a second angle θ2 to an extension surface S2 of the second contact surface 221, where the extension surface S2 is coplanar with the plane P2. The first angle θ1 and the second angle θ2 are not less than 0.5 degrees and not larger than 90 degrees. The first inclined guiding surface 213 of the first flattening part 210 and the second inclined guiding surface 223 of the second flattening part 220 can help the photovoltaic module 20 to enter into the gap between the first roller 110 and the second roller 120.

In this embodiment, the minimum width W1 of the gap 230 between the first flattening part 210 and the second flattening part 220 is not less than 3 millimeters and not larger than 6 millimeters. In detail, the gap 230 has a wide portion 231 and a narrow portion 232 connected to each other, the wide portion 231 is located between the first inclined guiding surface 213 and the second inclined guiding surface 223, and the narrow portion 232 is located between the first contact surface 211 and the second contact surface 221. The wide portion 231 tapers towards the narrow portion 232, and the narrow portion 232 is narrower than the wide portion 231. The minimum width W1 is measured at the narrow portion 232. The minimum width W1 is approximately equal to the thickness of a photovoltaic module without shattered glass. In this embodiment, the width W1 of the narrow portion 232 is, for example, equal to 4.3 millimeters.

The cutting tool 300 is located aside the flattening device 200, and the flattening device 200 is located between the first roller 110 and the second roller 120 of the conveyor 100 and the cutting tool 300. In detail, the first flattening part 210 of the flattening device 200 is located between the first roller 110 and the cutting tool 300, and the first flattening part 210 and the cutting tool 300 are opposite to the second flattening part 220.

In this embodiment, the first contact surface 211 of the first flattening part 210 has an edge 2111 located at a side of the first contact surface 211 located away from the first roller 110. The edge 2111 is located at a first reference plane P3 perpendicular to the first contact surface 211 of the first flattening part 210. In addition, the second contact surface 221 of the second flattening part 220 has an edge 2211 located at a side of the second contact surface 221 located away from the second roller 120. The edge 2211 is located at a second reference plane P4 perpendicular to the second contact surface 221 of the second flattening part 220. At least part of the cutting tool 300 is located between the first reference plane P3 and the second reference plane P4. As shown, at least part of the cutting tool 300 is located right above the second flattening part 220; in other words, at least part of the second flattening part 220 is located right under the cutting tool 300.

The cutting tool 300 has a cutting edge 310. The cutting edge 310 is located on the first reference plane P3 and located closer to the second contact surface 221 of the second flattening part 220 than the first contact surface 211 of the first flattening part 210.

In addition, the cutting tool 300 further has a blade surface 320. The blade surface 320 of the cutting tool 300 is connected to the cutting edge 310. The blade surface 320 of the cutting tool 300 is at an angle θ3 to the extension surface S1 of the first contact surface 211. The angle θ3 is not less than 0.5 degrees and not larger than 45 degrees.

In this or another embodiment, the recycle apparatus 10 may further include a heater 400, an inlet guiding component 500, an outlet guiding component 600, a first container 700, and a second container 800.

The heater 400 is embedded in the second flattening part 220. In this embodiment, the second flattening part 220 is made of thermal conductive material (e.g., metal or ceramic), such that the heat generated by the heater 400 can be conducted to the second flattening part 220. In this embodiment, when the photovoltaic module 20 is passing through the gap 230 between the first flattening part 210 and the second flattening part 220, the heater 400 can indirectly and directly heat the photovoltaic module 20. Specifically, the heater 400 can heat the photovoltaic module 20 via the second flattening part 220, the heater 400 also can directly heat the photovoltaic module 20 by directly thermally contacting it. Note that the position of the heater is not intended to limit the disclosure; in some other embodiments, the heater may be enclosed in the second flattening part, in such a case, the heater only can heat the photovoltaic module via the second flattening part.

Note that the material of the second flattening part 220 is not restricted to be thermal conductive; in some other embodiments, the second flattening part may be made of thermal insulation material, such as plastic, in such a case, the heater is preferably be exposed so as to directly heat the photovoltaic module passing through the gap between the first flattening part and the second flattening part.

As shown, when the photovoltaic module 20 is passing through the gap 230 between the first flattening part 210 and the second flattening part 220, the second flattening part 220 is located farther away from the back sheet 21 than the first flattening part 210. This can ensure that the heater 400 can soften the adhesive layer 24 before the back sheet 21 becomes soft, thereby facilitating the separation of the back sheet 21 from the glass sheet assembly 22 in the later process.

The inlet guiding component 500, for example, includes an upper guiding part 510 and a lower guiding part 520. The upper guiding part 510 is located at a side of the first roller 110 away from the first flattening part 210, and the lower guiding part 520 is located at a side of the second roller 120 away from the second flattening part 220. There is an inlet channel 530 located between the upper guiding part 510 and the lower guiding part 520. The inlet channel 530 extends upwards from the first roller 110 and the second roller 120. When the recycle apparatus 10 is placed on the ground, the inlet channel 530 extends toward a direction away from the ground. The inlet guiding component 500 can help the photovoltaic module 20 that is bent out of shape to reach the gap between the first roller 110 and the second roller 120 after it is placed into the inlet channel 530 being extending upwards.

The outlet guiding component 600, for example, includes a plurality of rollers 610. The outlet guiding component 600 is located at a side of the cutting tool 300 away from the first flattening part 210. The outlet guiding component 600 is configured to guide the back sheet 21 separated from the glass sheet assembly 22. The first container 700 and the second container 800 are respectively configured to accommodate the back sheet 21 and the glass sheet assembly 22.

Figure 3:
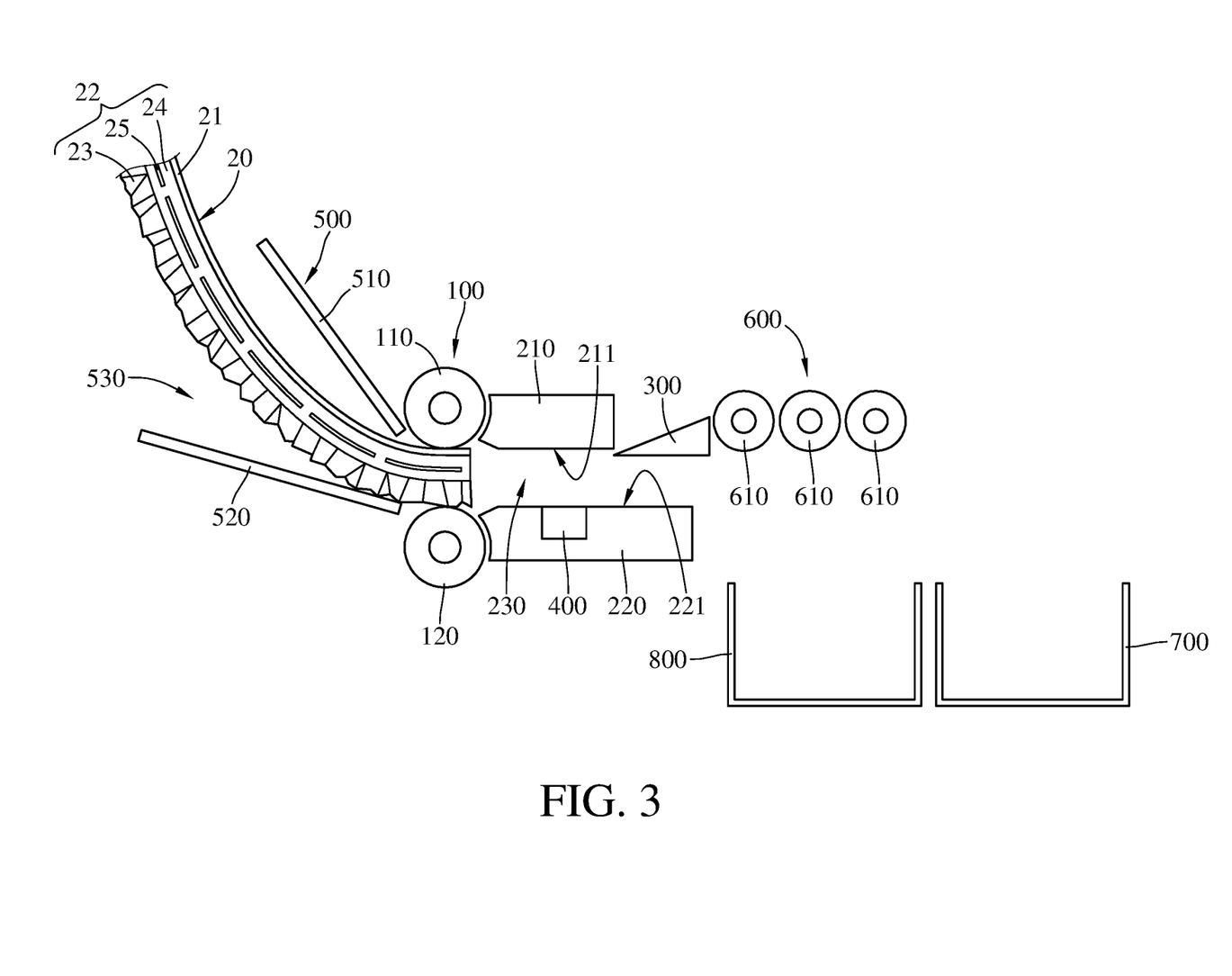
FIGS. 3 to 5 are schematic views of the recycle apparatus in FIG. 1 when separating a back sheet from a glass sheet assembly of the photovoltaic module.
Figure 4:
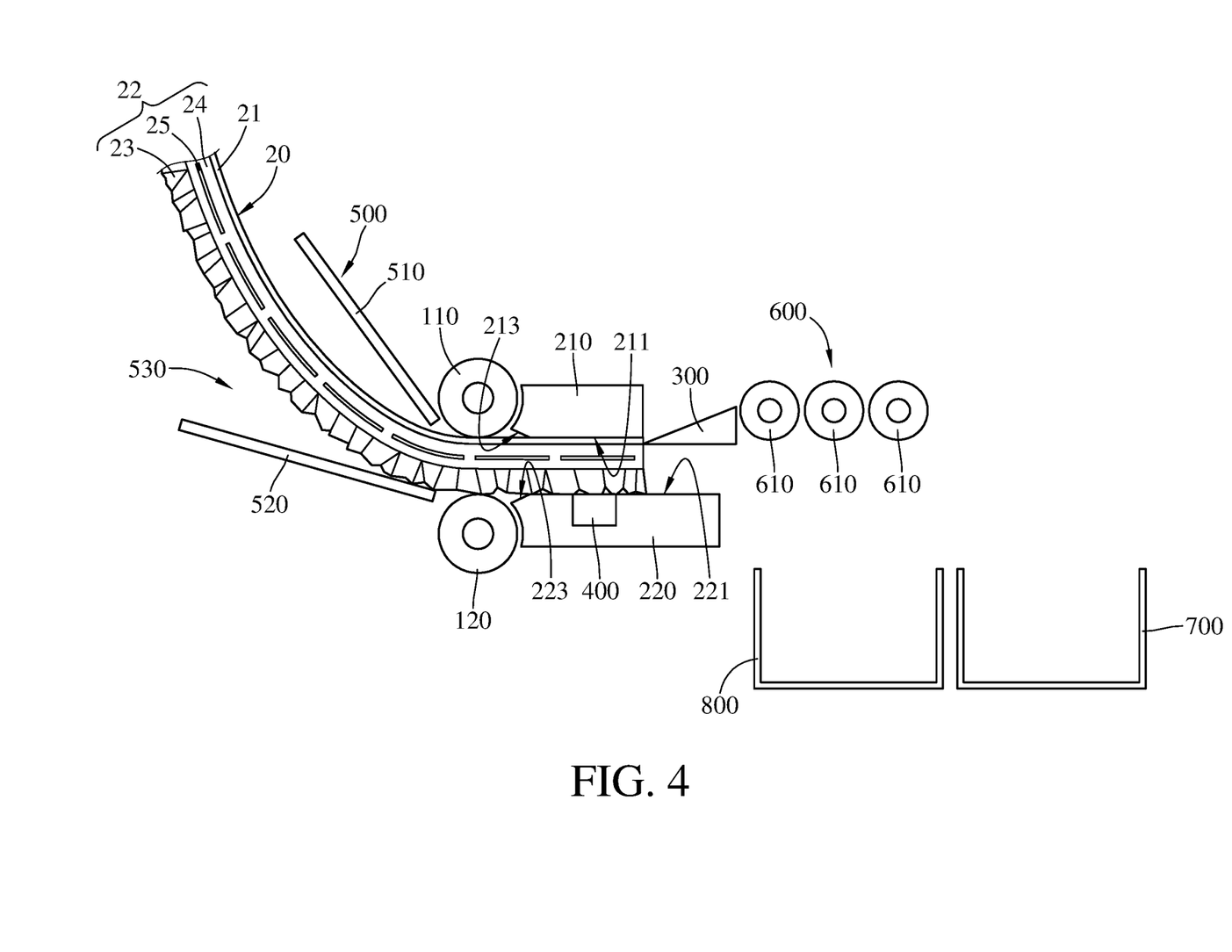
Figure 5:
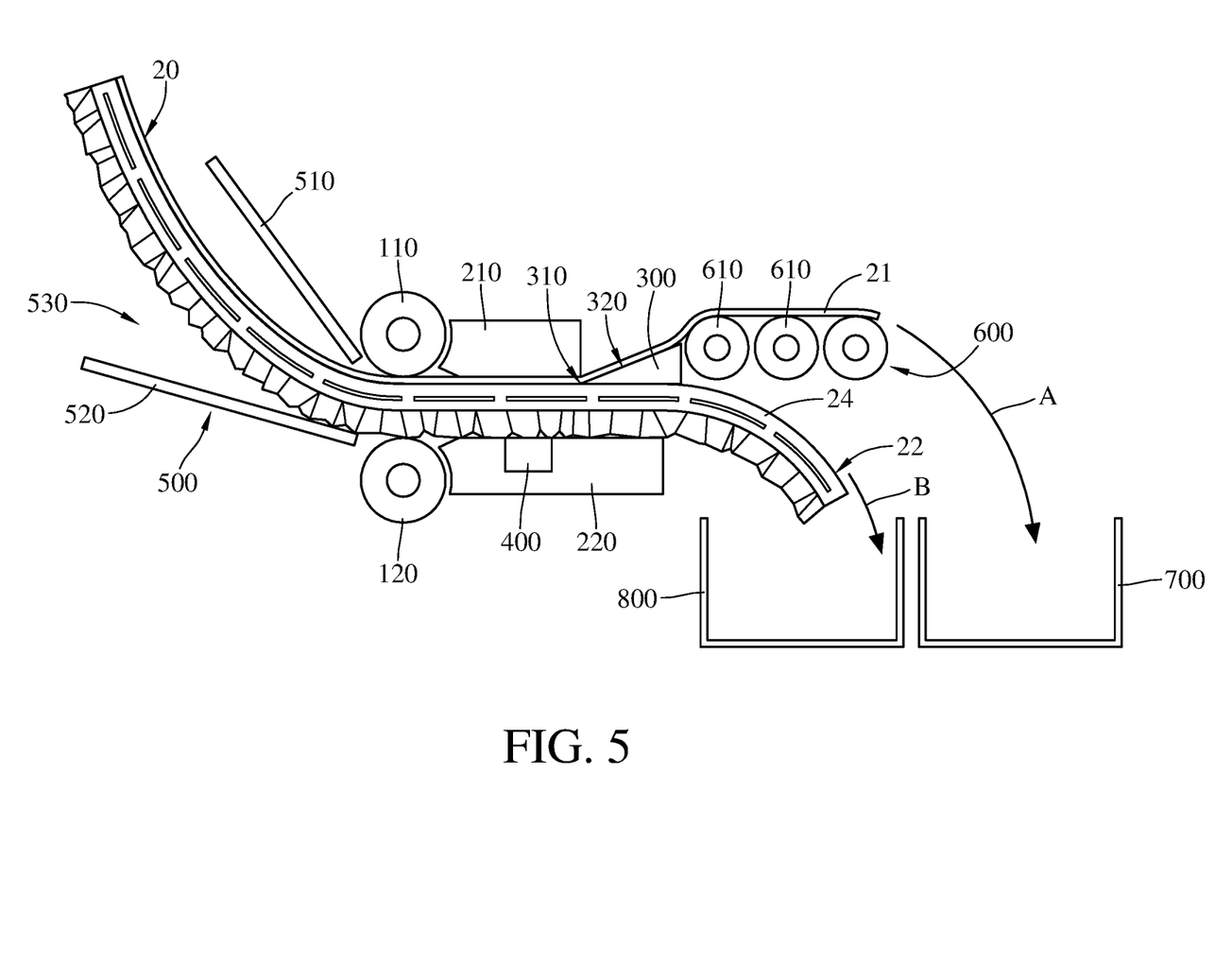

The separation of the back sheet 21 of the photovoltaic module 20 from the glass sheet assembly 22 will be described in further detail hereafter. Referring to FIGS. 3 to 5, there are shown schematic views of the recycle apparatus 10 in FIG. 1 when separating the back sheet 21 from the glass sheet assembly 22 of the photovoltaic module 20.

Firstly, as shown in FIG. 3, the photovoltaic module 20 with the glass layer 23 being shattered is placed into the inlet channel 530 of the inlet guiding component 500, and the inlet guiding component 500 can guide the photovoltaic module 20 towards the gap between the first roller 110 and the second roller 120. Then, the first roller 110 and the second roller 120 can start to press the photovoltaic module 20 and feed it towards the gap 230 between the first contact surface 211 of the first flattening part 210 and the second contact surface 221 of the second flattening part 220 that are respectively aligned with the first roller 110 and the second roller 120.

Note that the positions of the first roller 110 and the second roller 120 with respect to the first contact surface 211 and the second contact surface 221 are not intended to limit the disclosure; in some other embodiments, the first roller 110 and the second roller 120 may not be respectively aligned with the first contact surface 211 and the second contact surface 221.

Then, as shown in FIG. 4, the first roller 110 and the second roller 120 forces the photovoltaic module 20 to pass through the gap 230 (as shown in FIG. 2) between the first flattening part 210 and the second flattening part 220. As the photovoltaic module 20 reaches the gap 230, the first inclined guiding surface 213 and the second inclined guiding surface 223 can guide the photovoltaic module 20 to enter into the narrow portion 232 (as shown in FIG. 2) of the gap 230. The part of the photovoltaic module 20 in the narrow portion 232 is pressed and flattened by the first contact surface 211 and the second contact surface 221, and meanwhile, the adhesive layer 24 of the photovoltaic module 20 in the same part is heated and softened by the heater 400 and the second flattening part 220. In this embodiment, the heater 400 can heat the photovoltaic module 20 up to a temperature between 100 and 200 Celsius degrees, such as 150 degrees.

Note that the inclined guiding surfaces 213 and 223 are optional; in some other embodiments, only the first flattening part or the second flattening part may have the inclined guiding surface, or both of them have no inclined guiding surface.

Then, as shown in FIG. 5, the first roller 110 and the second roller 120 keep delivering the photovoltaic module 20, such that the cutting edge 310 of the cutting tool 300 can gradually separate the back sheet 21 from the adhesive layer 24 of the glass sheet assembly 22. While the photovoltaic module 20 is kept moving by the first roller 110 and the second roller 120, the back sheet 21 moves over the blade surface 320 of the cutting tool 300 and goes onto the rollers 610 of the outlet guiding component 600, and the glass sheet assembly 22 is kept moving forwards. Then, the back sheet 21 can be stored in the first container 700 along the arrow A, and the glass sheet assembly 22 can be stored in the second container 800 along the arrow B. As a result, the back sheet 21 of the photovoltaic module 20 can be completely separated from the glass sheet assembly 22.

In this embodiment, the flattening device 200 is located between the first roller 110 and the second roller 120 of the conveyor 100 and the cutting tool 300, such that the photovoltaic module 20 can be flattened before the removal of the back sheet 21. This ensures that the photovoltaic module 20 can be held in a proper position for the facilitation of the cutting tool 300 to separate the back sheet 21 from the glass sheet assembly 22.

In addition, the second flattening part 220 is partially located below the cutting tool 300, such that the second flattening part 220 can support the photovoltaic module 20 when the cutting tool 300 separates the back sheet 21 from the glass sheet assembly 22, thereby facilitating the separation of the back sheet 21 from the glass sheet assembly 22. In other embodiments, the second flattening part 220 may not be partially located below the cutting tool 300.

The recycle apparatus 10 is also suitable for separating a back sheet form a flat photovoltaic module. For example, referring to FIG. 6, there is shown a schematic view of the recycle apparatus 10 in FIG. 1 when the position of its inlet guiding component 500 has been adjusted.

Figure 6:
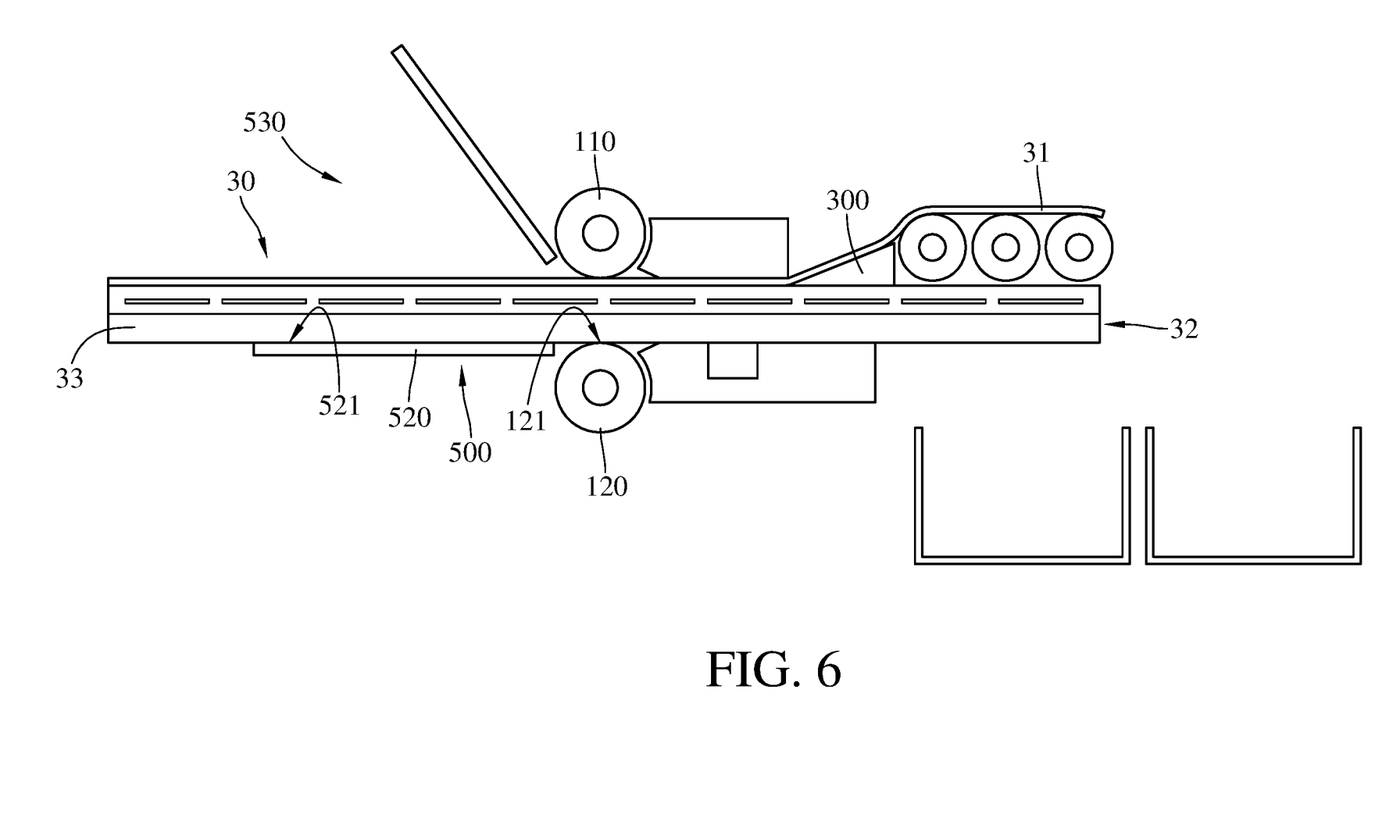
FIG. 6 is a schematic view of the recycle apparatus in FIG. 1 when the position of its inlet guiding component has been adjusted.

As shown in FIG. 6, a photovoltaic module 30 having a glass layer 33 without being shattered is in a flat shape, such that the surface 521 of the lower guiding part 520 of the inlet guiding component 500 facing the inlet channel 530 can be adjusted to be coplanar with the plane P2 (as shown in FIG. 2) tangent to the second edge 121 of the second roller 120. Therefore, the inlet guiding component 500 can smoothly guide the photovoltaic module 30 to the gap between the first roller 110 and the second roller 120, and then the first roller 110 and the second roller 120 will deliver the photovoltaic module 30 to the cutting tool 300 for separating the back sheet 31 of the photovoltaic module 30 from the glass sheet assembly 32.

Figure 7:
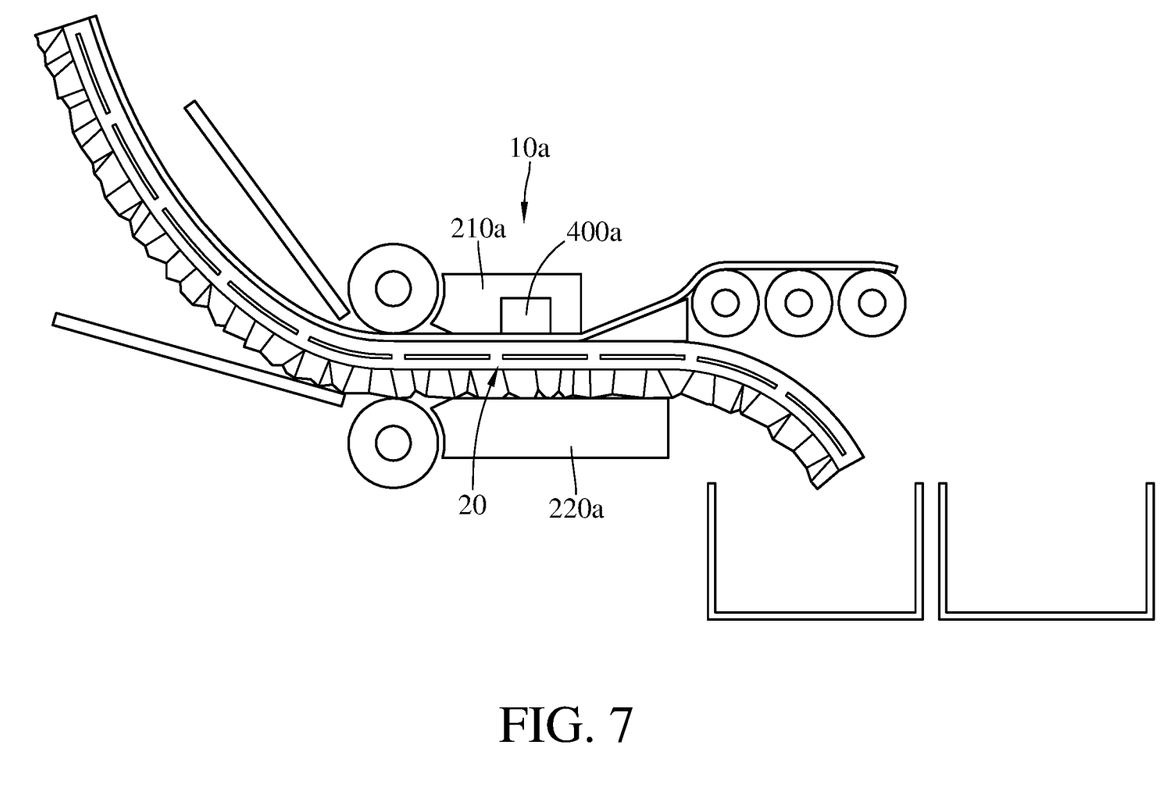
FIG. 7 is a schematic view of a recycle apparatus according to a second embodiment of the disclosure.

Then, referring to FIG. 7, there is shown a schematic view of a recycle apparatus 10a according to a second embodiment of the disclosure.

In this embodiment, the recycle apparatus 10a is similar to the recycle apparatus 10 shown in FIG. 1 of the previous embodiment, therefore the following paragraphs will mainly introduce the differences between them, the similar or same parts will not be described hereinafter.

In this embodiment, a heater 400a of the recycle apparatus 10a is embedded in a first flattening part 210a of the recycle apparatus 10a. The first flattening part 210a is, for example, made of thermal conductive material (e.g., metal or ceramic). When the first flattening part 210a and a second flattening part 220a of the recycle apparatus 10a press the photovoltaic module 20, the heater 400a can heat the photovoltaic module 20 via the first flattening part 210a, and the heater 400a also directly heat the photovoltaic module 20 by directly thermally contacting it. However, the present disclosure is not limited thereto; in some other embodiments, the heater may be only indirectly heat the first flattening part via the photovoltaic module.

On the other hand, the first flattening part 210a may be made of thermal insulation material, such as plastic; in such a case, the heater is preferably be exposed so as to directly heat the photovoltaic module passing through the gap between the first flattening part and the second flattening part.

Figure 8:
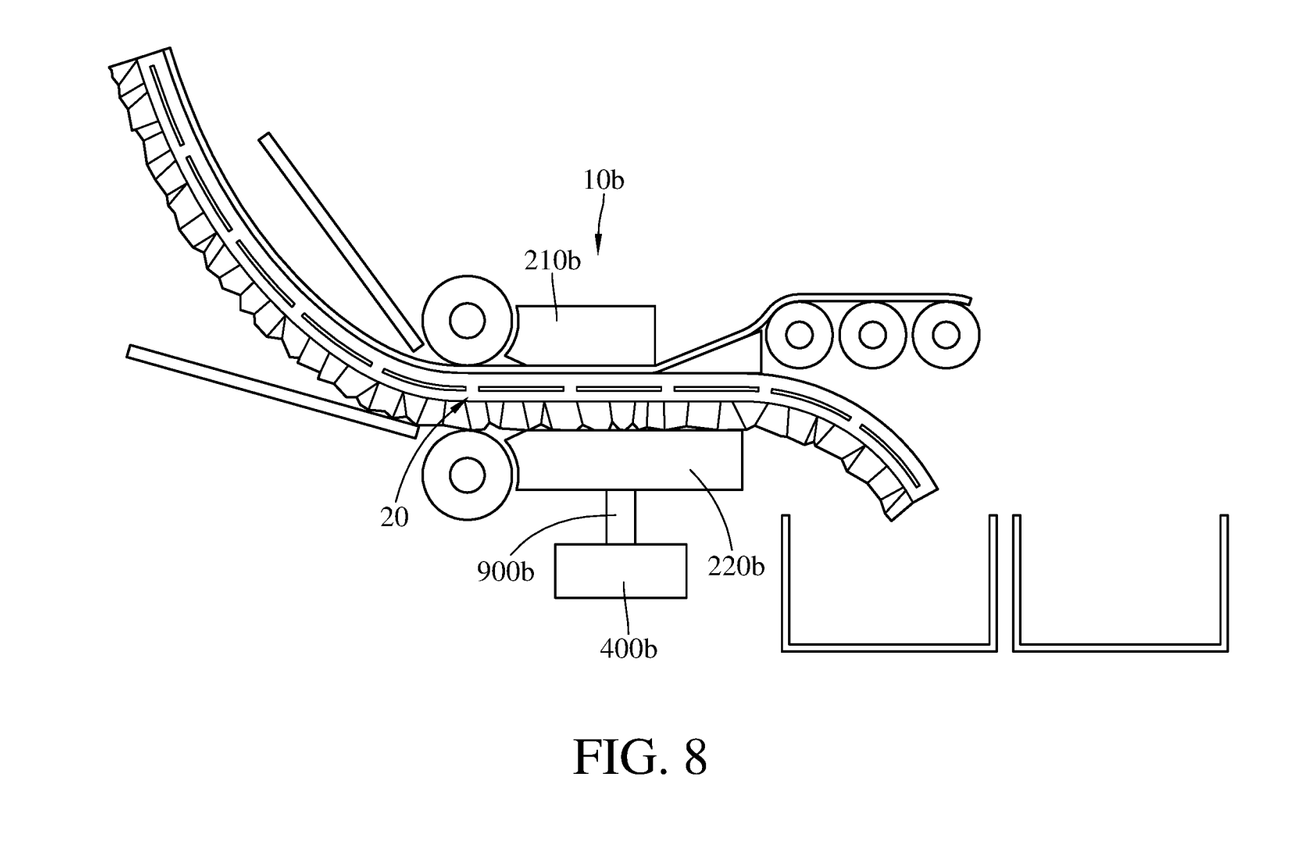
FIG. 8 is a schematic view of a recycle apparatus according to a third embodiment of the disclosure.

Then, referring to FIG. 8, there is shown a schematic view of a recycle apparatus 10b according to a third embodiment of the disclosure.

In this embodiment, the recycle apparatus 10b is similar to the recycle apparatus 10 shown in FIG. 1 of the previous embodiment, therefore the following paragraphs will mainly introduce the differences between them, the similar or same parts will not be described hereinafter.

In this embodiment, a second flattening part 220b of the recycle apparatus 10b is, for example, made of thermal conductive material (e.g., metal or ceramic). The heater 400b is connected to a second flattening part 220b of the recycle apparatus 10b via, for example, a thermal conductive component 900b (e.g., a heat pipe). As such, the heat generated by the heater 400b can be conducted to the second flattening part 220b via the thermal conductive component 900b. Therefore, when a first flattening part 210b and the second flattening part 220b of the recycle apparatus 10b press the photovoltaic module 20, the heater 400b can heat the photovoltaic module 20 via the second flattening part 220b.

However, the heater 400b is not restricted to heat the photovoltaic module 20 via the thermal conductive component 900b and the second flattening part 220b; in some other embodiments, the first flattening part may be made of thermal conductive material, and the heater may heat the photovoltaic module 20 via the thermal conductive component connected to the first flattening part and the first flattening part.

In the aforementioned embodiments, each of the recycle apparatuses includes the heater, the inlet guiding component, the outlet guiding component, the first container, and the second container, but the present disclosure is not limited thereto; in some other embodiments, the recycle apparatus may not include the heater, the inlet guiding component, the outlet guiding component, the first container and the second container.

According to the recycle apparatuses as discussed above, the flattening device capable of flattening the photovoltaic module is located between the conveyor and the cutting tool, thus the photovoltaic module can be flattened before it reaches to the cutting tool. This ensures that the photovoltaic module can be held in a proper position for the facilitation of the cutting tool to separate the back sheet from the glass sheet assembly.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A recycle apparatus configured to separate a back sheet from a glass sheet assembly of a photovoltaic module, the recycle apparatus comprising:
   a conveyor, comprising a first roller and a second roller opposite to each other;
   a flattening device, located aside the first roller and the second roller; and
   a cutting tool, located aside the flattening device, wherein the flattening device is located between the first roller and the second roller of the conveyor and the cutting tool;

wherein the first roller and the second roller are configured to press and feed the photovoltaic module to the flattening device for allowing the photovoltaic module to be flattened by the flattening device, and then the flattened photovoltaic module is fed to the cutting tool by the first roller and the second roller for allowing the back sheet to be separated from the glass sheet assembly by the cutting tool;

wherein the recycle apparatus further comprises a heater, the flattening device comprises a first flattening part and a second flattening part opposite to each other, the first flattening part and the second flattening part are configured to press the photovoltaic module, the first flattening part and the second flattening part are respectively located aside the first roller and the second roller, and the heater is disposed on one of the first flattening part and the second flattening part;

wherein the first flattening part has a first curved concave surface, the first curved concave surface faces the first roller, the second flattening part has a second curved concave surface, the second curved concave surface faces the second roller, a distance between the first curved concave surface and the first roller and a distance between the second curved concave surface and the second roller are not less than 0.1 millimeters and not larger than 6 millimeters;

wherein when the first flattening part and the second flattening part press the photovoltaic module, the first flattening part is located closer to the back sheet than the second flattening part, the first flattening part has a first contact surface facing the second flattening part, the first contact surface has an edge located at a side of the first contact surface away from the first roller, the edge of the first contact surface is located at a first reference plane perpendicular to the first contact surface, the cutting tool has a cutting edge, and the cutting edge is located at the first reference plane and located closer to the first contact surface than the second flatting part.

2. The recycle apparatus according to claim 1, wherein the heater is disposed on the second flattening part.

3. The recycle apparatus according to claim 1, wherein there is a gap formed between the first flattening part and the second flattening part, and the gap has a width not less than 3 millimeters and not larger than 6 millimeters.

4. The recycle apparatus according to claim 1, wherein the second flattening part has a second contact surface, the first contact surface faces the second contact surface, the first roller has a first edge located at a side of the first roller located close to the second roller, a plane tangent to the first edge is coplanar with the first contact surface, the second roller has a second edge located at a side of the second roller located close to the first roller, and a plane tangent to the second edge is coplanar with the second contact surface.

5. The recycle apparatus according to claim 1, wherein the first flattening part has a first inclined guiding surface connected to the first contact surface, the first inclined guiding surface is located closer to the first roller than the first contact surface, the second flattening part has a second inclined guiding surface and a second contact surface connected to each other, the second inclined guiding surface is located closer to the second roller than the second contact surface, the first contact surface faces the second contact surface, the first inclined guiding surface is at an first angle to an extension surface of the first contact surface, the second inclined guiding surface is at a second angle to an extension surface of the second contact surface, and the first angle and the second angle are not less than 0.5 degrees and not larger than 90 degrees.

6. The recycle apparatus according to claim 1, wherein the second flattening part has a second contact surface facing the first contact surface, the second contact surface has an edge located at a side of the second contact surface away from the second roller, the edge of the second contact surface is located at a second reference plane perpendicular to the second contact surface, and the cutting tool is partially located between the first reference plane and the second reference plane.

7. The recycle apparatus according to claim 1, wherein the cutting tool further has a blade surface, the blade surface of the cutting tool is connected to the cutting edge, the blade surface of the cutting tool is at an angle to an extension surface of the first contact surface, and the angle is not less than 0.5 degrees and not larger than 45 degrees.

8. The recycle apparatus according to claim 1, wherein the flattening device is made of thermal conductive material, and the heater is configured to the heat the photovoltaic module via the flattening device.

* * * * *